United States Patent
Burns et al.

(10) Patent No.: US 10,056,290 B2
(45) Date of Patent: Aug. 21, 2018

(54) SELF-ALIGNED PATTERN FORMATION FOR A SEMICONDUCTOR DEVICE

(71) Applicant: International Business Machines Corporation, Armonk, NY (US)

(72) Inventors: Sean D. Burns, Hopewell Junction, NY (US); Lawrence A. Clevenger, Rhinebeck, NY (US); Nelson M. Felix, Briarcliff Manor, NY (US); Sivananda K. Kanakasabapathy, Niskayuna, NY (US); Christopher J. Penny, Saratoga Springs, NY (US); Nicole Saulnier, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/198,827

(22) Filed: Jun. 30, 2016

(65) Prior Publication Data

US 2018/0005875 A1     Jan. 4, 2018

(51) Int. Cl.
| | |
|---|---|
| *H01L 21/4763* | (2006.01) |
| *H01L 23/48* | (2006.01) |
| *H01L 23/52* | (2006.01) |
| *H01L 21/768* | (2006.01) |
| *H01L 23/528* | (2006.01) |
| *H01L 23/522* | (2006.01) |

(52) U.S. Cl.
CPC .. *H01L 21/76816* (2013.01); *H01L 21/76877* (2013.01); *H01L 23/528* (2013.01); *H01L 23/5226* (2013.01)

(58) Field of Classification Search
CPC ........... H01L 21/76877; H01L 23/5226; H01L 23/528; H01L 21/768; H01L 21/76816; H01L 23/3142; H01L 23/53223; H01L 23/53238; H01L 23/53252; H01L 23/53266; H01L 24/26
USPC .................................. 438/118, 622; 257/758
See application file for complete search history.

(56) References Cited

U.S. PATENT DOCUMENTS

| | | |
|---|---|---|
| 8,261,229 B2 | 9/2012 | Hart |
| 8,667,443 B2 | 3/2014 | Smayling et al. |
| 8,813,016 B1* | 8/2014 | Hsu ..................... G06F 17/5072 716/120 |
| 8,945,800 B2 | 2/2015 | Chiou et al. |
| 8,954,913 B1 | 2/2015 | Yuan et al. |
| 8,966,412 B1* | 2/2015 | Yuan ........................ G03F 1/70 716/50 |
| 9,213,795 B2 | 12/2015 | Hsu et al. |
| 9,262,570 B2 | 2/2016 | Hsu et al. |
| 2015/0286764 A1 | 10/2015 | Yuan et al. |
| 2016/0307850 A1* | 10/2016 | Lin ....................... H01L 29/785 |

* cited by examiner

*Primary Examiner* — Kimberly Rizkallah
*Assistant Examiner* — Dilinh Nguyen
(74) *Attorney, Agent, or Firm* — Cantor Colburn LLP; Vazken Alexanian

(57) ABSTRACT

A method of forming a self-aligned pattern of vias in a semiconductor device comprises forming a first layer of mandrels, then forming a second layer of mandrels orthogonal to the first layer of mandrels. The layout of the first and second layers of mandrels defines a pattern that can be used to create vias in a semiconductor material. Other embodiments are also described.

12 Claims, 13 Drawing Sheets

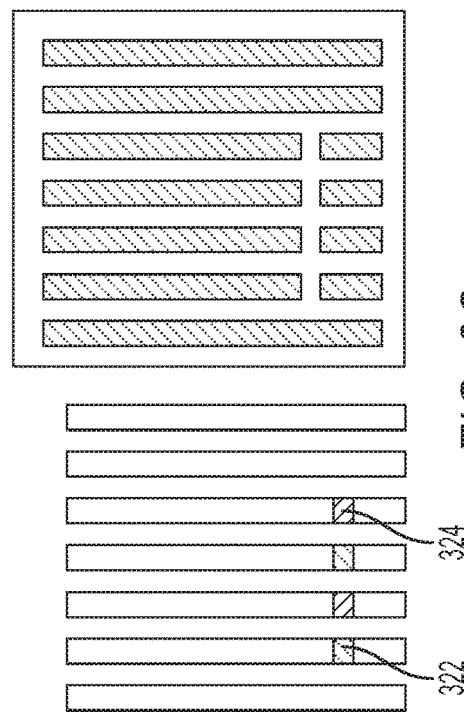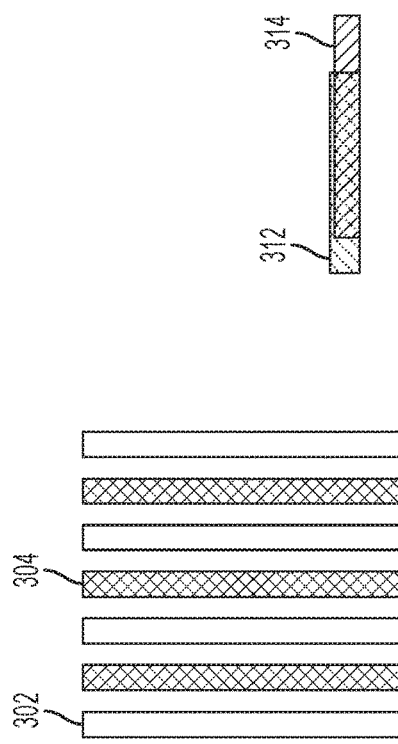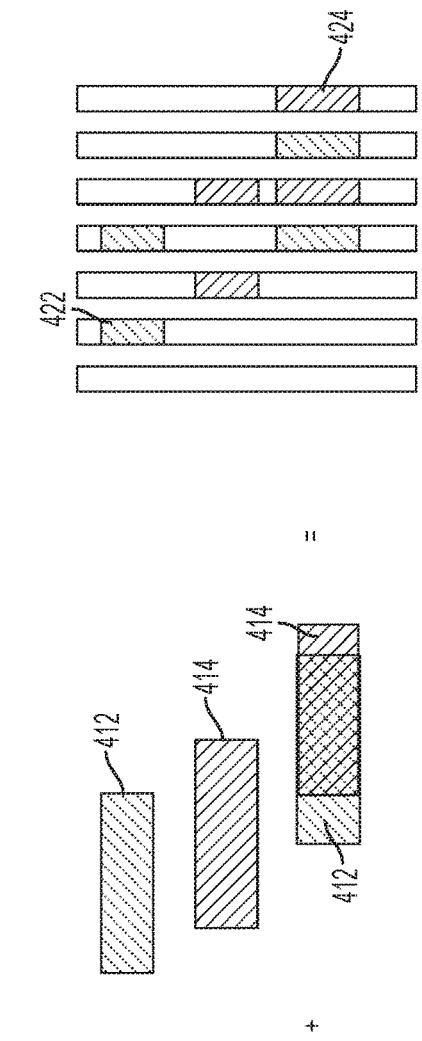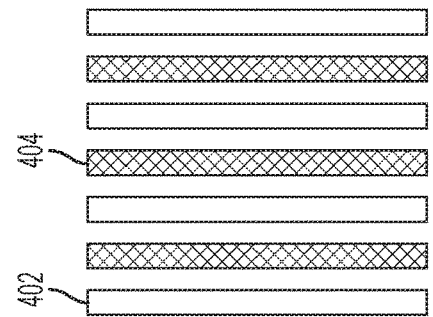

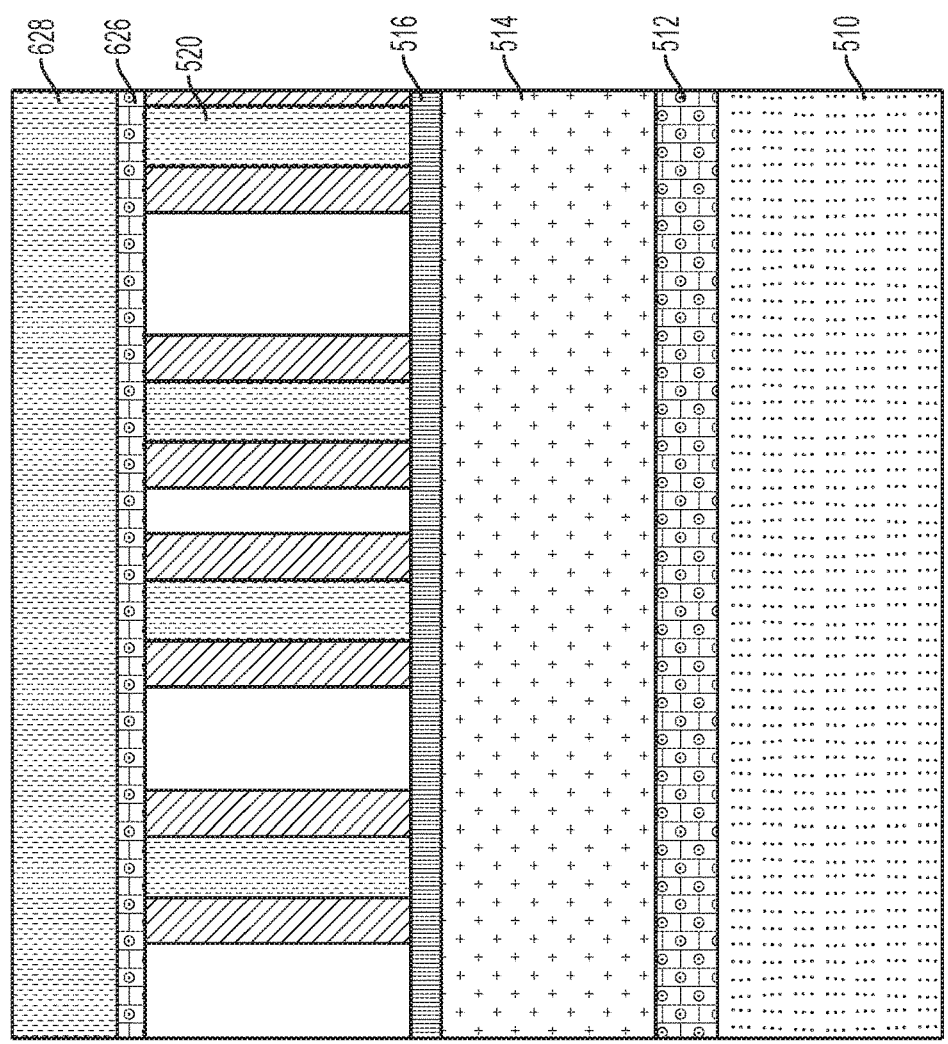
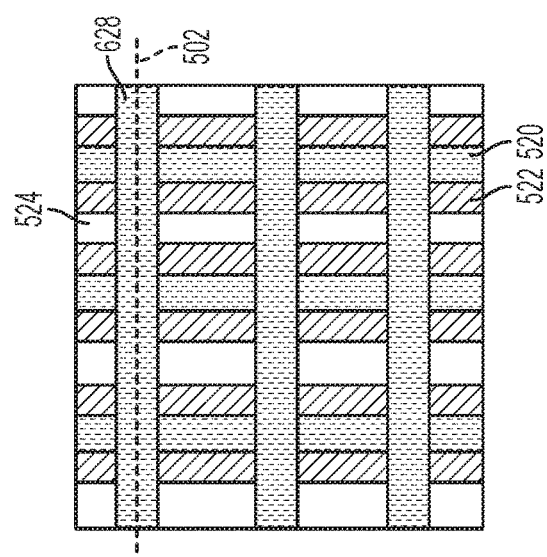
FIG. 6B
FIG. 6A

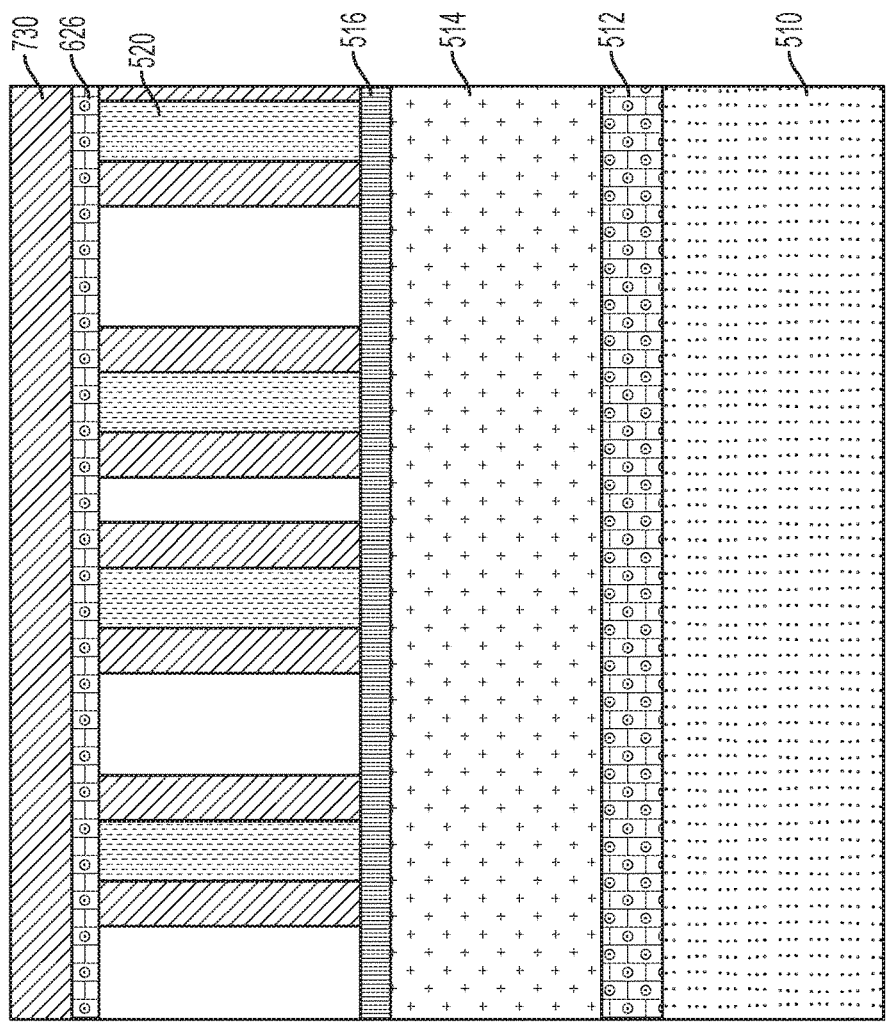
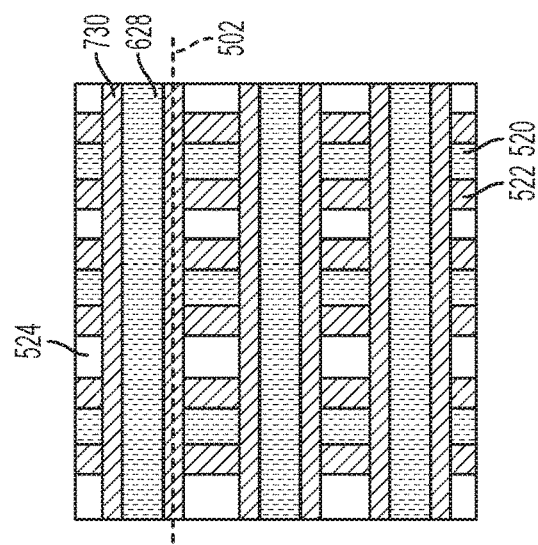
FIG. 7B
FIG. 7A

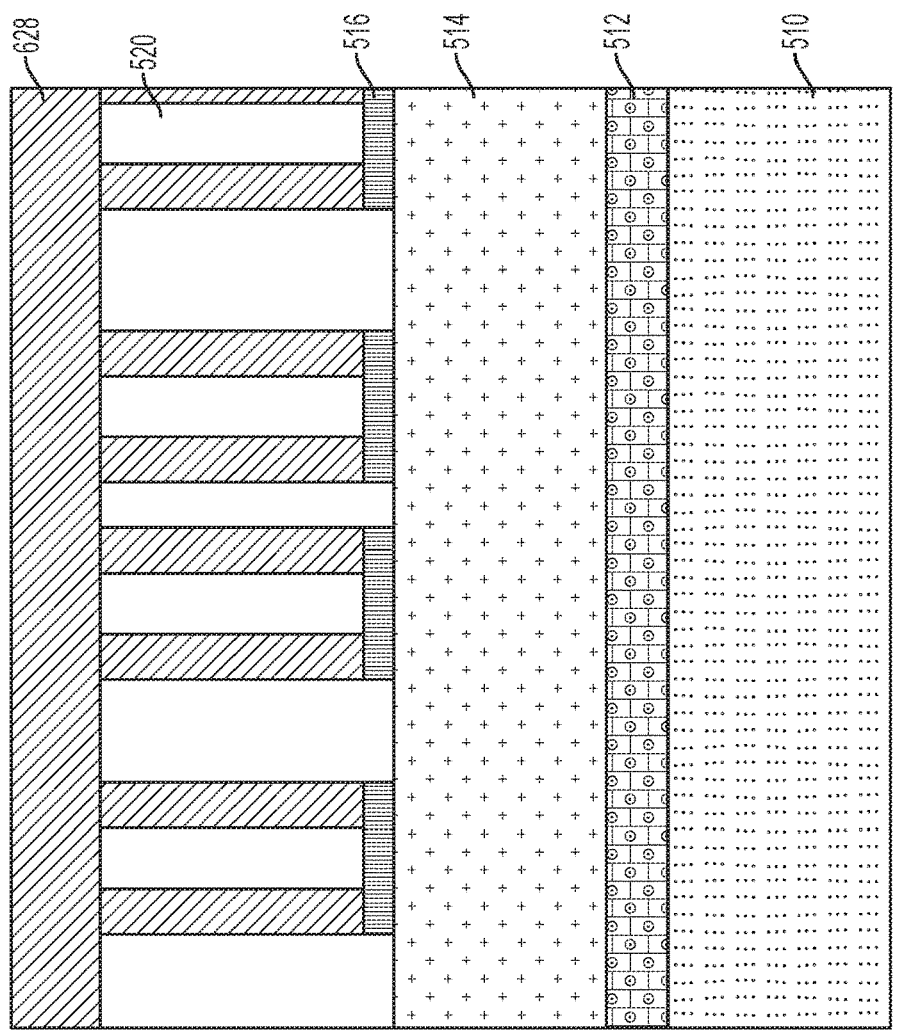
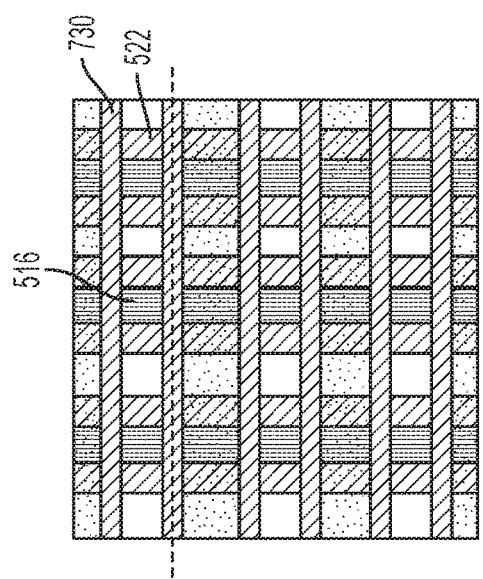
FIG. 11B
FIG. 11A

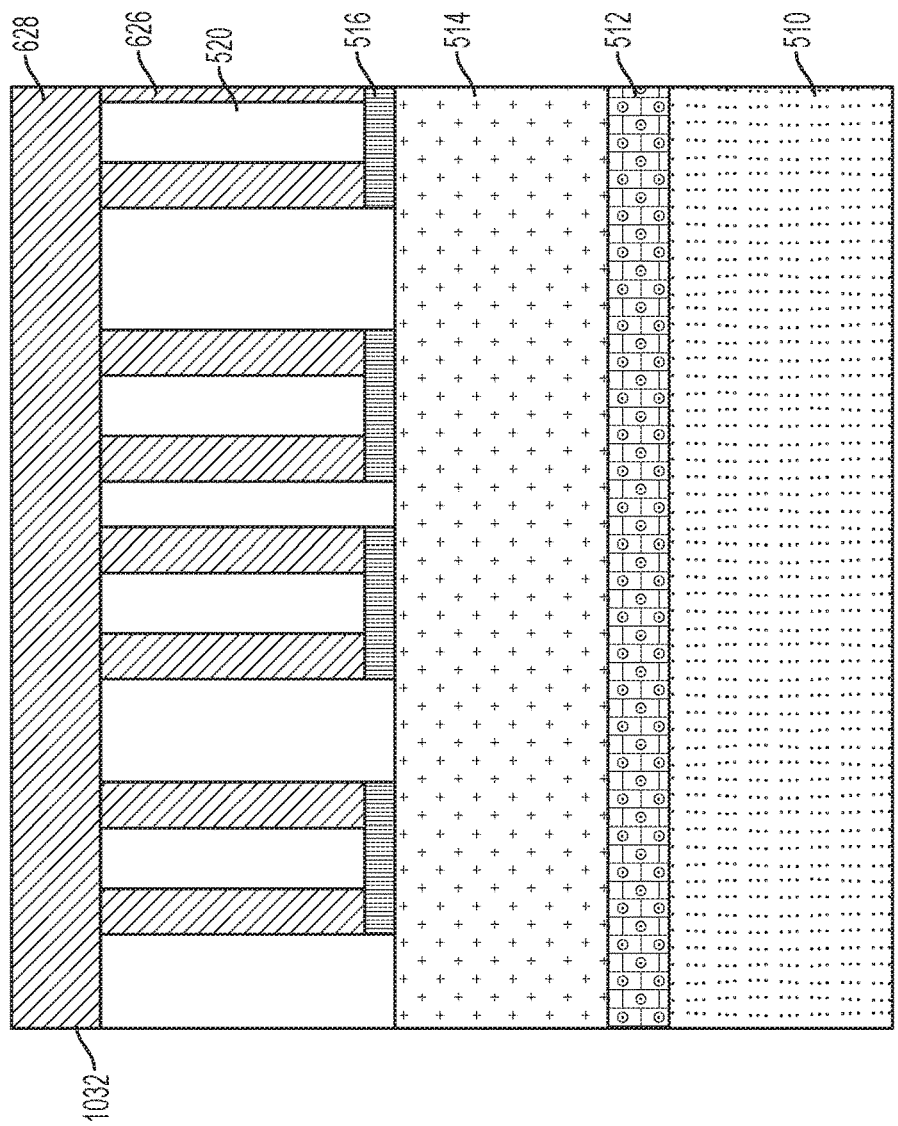
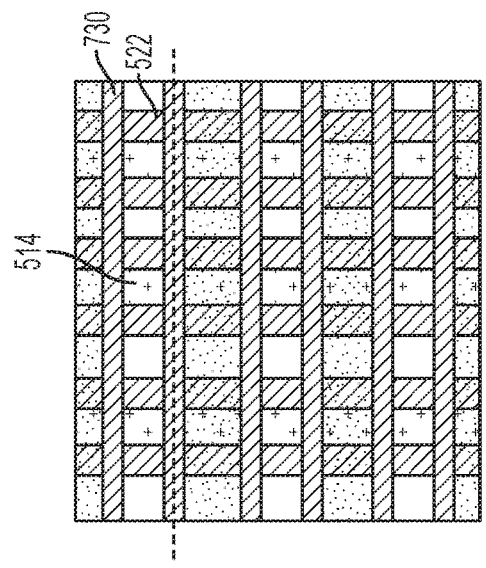

SELF-ALIGNED PATTERN FORMATION FOR A SEMICONDUCTOR DEVICE

BACKGROUND

This document relates in general to integrated circuits and methods of fabrication. More specifically, this document relates to back end of line (BEOL) patterning.

Typical integrated circuits are formed by first fabricating individual semiconductor devices using processes referred to generally as the front end of line (FEOL). Thereafter, the individual devices on the integrated circuit are interconnected by forming the wiring of the wafer using processes referred to generally as the back end of line (BEOL). BEOL processes generally include the formation of contacts, insulating layers, metal layers, and bonding sites for chip-to-package connections.

A basic design construct of BEOL processes is the formation of a staggered configuration of vias or block mask structures, whereby the shapes are placed on a non-orthogonal array grid. Such structures can be challenging to image as feature sizes become smaller.

SUMMARY

Described herein is a method of forming vias in a semiconductor. The method includes providing a semiconductor wafer in which front end of line (FEOL) processing has been completed. A hard mask is deposited on an optical planarization layer (OPL). A first layer is formed with one or more mandrels on the hard mask. A non-mandrel material is placed between each of the one or more mandrels. An etch stop is deposited over the first layer of one or more mandrels. A second layer is formed with one or more mandrels on the etch stop layer. The non-mandrel material that is not covered by the second layer is etched. The one or more mandrels of the first layer and the one or more mandrels of the second layer down are removed down to the hard mark to form a pattern in the hard mask.

Also described is an integrated circuit having a plurality of components formed in a FEOL process, one or more metal lines coupling two or more components to each other, and one or more vias arranged to couple together two metal lines. The vias are formed by providing a semiconductor wafer in which FEOL processing has been completed. A hard mask is deposited on an OPL. A first layer is formed with one or more mandrels on the hard mask. A non-mandrel material is placed between each of the one or more mandrels. An etch stop is deposited over the first layer of one or more mandrels. A second layer is formed with one or more mandrels on the etch stop layer. The non-mandrel material that is not covered by the second layer is etched. The one or more mandrels of the first layer and the one or more mandrels of the second layer down are removed down to the hard mark to form a pattern in the hard mask, and the pattern is used to form one or more vias.

Also described herein is a method of forming vias in a semiconductor. The method includes providing a semiconductor wafer in which FEOL processing has been completed. A hard mask is deposited on an OPL. A first layer is formed with one or more mandrels on the hard mask, wherein the mandrels in the first layer are in a first orientation. A second layer is formed with one or more mandrels over the first layer, wherein the mandrels in the second layer are in a second orientation that is orthogonal to the first orientation. A combination of the first layer and the second layer is used to form a pattern on the hard mask that is used to form one or more vias.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

FIG. 3A shows one set of mandrels used in an exemplary embodiment;

FIG. 3B shows one set of mandrels used in an exemplary embodiment;

FIG. 3C shows how two sets of mandrels combine in an exemplary embodiment;

FIG. 4A shows one set of mandrels used in an exemplary embodiment;

FIG. 4B shows one set of mandrels used in an exemplary embodiment;

FIG. 4C shows how two sets of mandrels combine in an exemplary embodiment;

FIG. 6A depicts an overhead view of a semiconductor device after the addition of a mask and a mandrel in a direction orthogonal to the earlier set of mandrels;

FIG. 6B depicts a cross-sectional view of a semiconductor device after the addition of a mask and a mandrel in a direction orthogonal to the earlier set of mandrels;

FIG. 7A depicts an overhead view of the addition of a spacer to the top layer of mandrels;

FIG. 7B depicts a cross-sectional view of the addition of a spacer to the top layer of mandrels;

FIG. 11A depicts an overhead view of the removal of mandrels;

FIG. 11B depicts a cross-sectional view of the removal of mandrels;

FIG. 12A depicts an overhead view of the removal of exposed areas of hard mask;

FIG. 12B depicts a cross-sectional view of the removal of exposed areas of hard mask;

DETAILED DESCRIPTION

It is understood in advance that although a detailed description of an exemplary process of back end of line (BEOL) patterning is presented, implementation of the teachings recited herein are not limited to any particular structure described herein. Rather, embodiments of the present invention are capable of being implemented in conjunction with any other type of integrated circuit now known or later developed.

Figure 1:
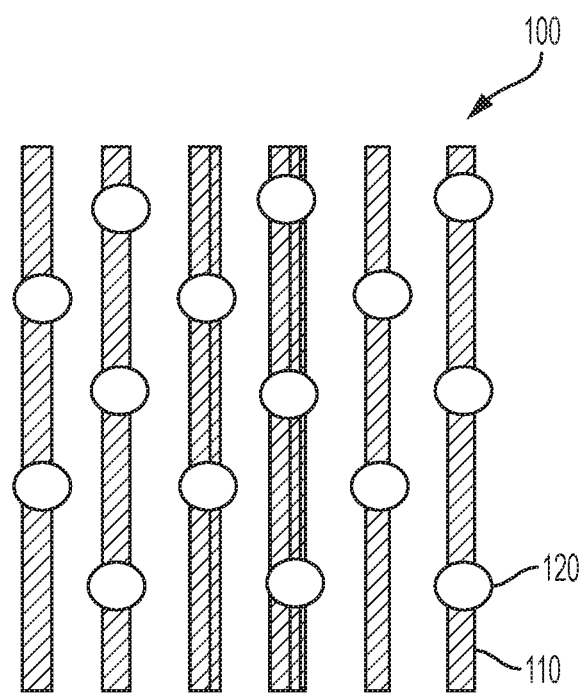
FIG. 1 depicts an exemplary pattern of vias for a semiconductor.

Described herein is a novel design and structure for self-aligned pattern formation for semiconductor fabrication. As described above, a semiconductor might include multiple transistors, resistors, capacitors, and other components constructed during a FEOL process. Joining together multiple components are a metallization layer comprising a series of contacts, insulating layers, interconnect wires, bonding sites, and vias constructed during BEOL processing, wherein the vias are used to couple together metal lines that are on different levels. One basic design construct of BEOL processing is the use of a staggered configuration of vias or block mask structures, whereby the shapes are placed on a non-orthogonal array grid. An exemplary pattern is shown in FIG. 1. As shown in FIG. 1, structure 100 includes lines 110 and vias 120 in a staggered pattern such that vias are not located directly next to each other. A potential issue with such a configuration is that a staggered structure can be difficult to image, particularly as feature sizes become smaller. A reason for this issue is that the mask making process utilizes a horizontal and a vertical e-beam rastor. While such a configuration might be sufficient for making horizontal or vertical lines, the configuration might not produce high-fidelity shapes on a diagonal or non-orthogonal line, particularly when being used in semiconductors-based technologies having small feature sizes. While vias or other cut shapes can be placed in a staggered array formation, the critical dimension of a via is traditionally two times that of the lines, especially for a unidirectional application.

Figure 2C:
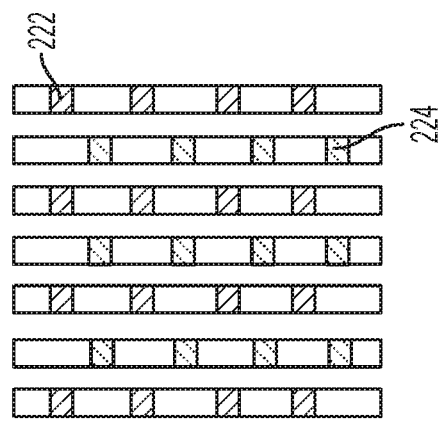
FIG. 2C shows how two sets of mandrels combine in an exemplary embodiment.
Figure 2B:
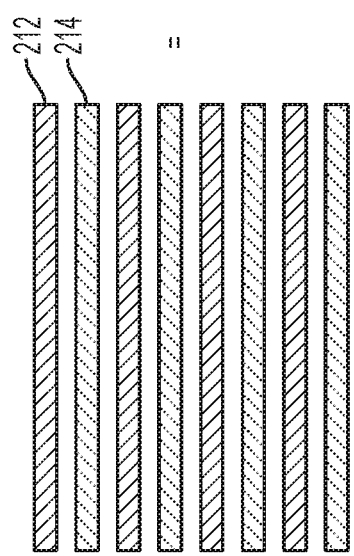
FIG. 2B shows one set of mandrels used in an exemplary embodiment.
Figure 2A:
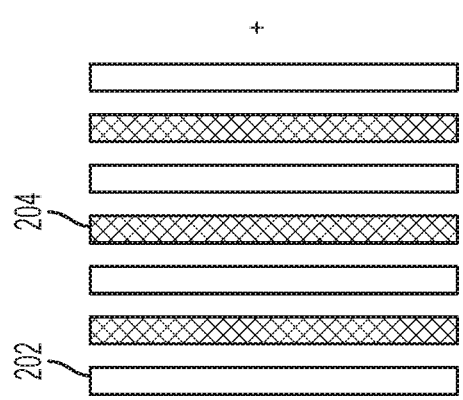
FIG. 2A shows one set of mandrels used in an exemplary embodiment.

In some embodiments, the above-referenced issues can be addressed through the use of the processes described herein. An overview of the technique is presented in FIGS. 2A-2C. In FIG. 2A, a mandrel mask 202 and non-mandrel material 204 are presented. Both mandrel mask 202 and a non-mandrel 204 are vertical. In FIG. 2B, orthogonal to mandrel mask 202 and a non-mandrel 204 are two different block masks or mandrels 212 and 214. When both patterns are applied to a semiconductor, with the layer comprising mandrels 212 and 214 overlying the layer comprising mandrel 202 and non-mandrel 204, the result is shown in FIG. 2C. In FIG. 2C, it can be seen that mandrel 202 matches with block mask 212 to result in mask pattern 222. Non-mandrel 204 matches with block mask 214 to result in mask pattern 224. In some embodiments, mandrel mask 202 and non-mandrel 204 are formed using a self-aligned double pattern (SADP) technique in a particular orientation. The block mask techniques shown in FIG. 2B could be achieved where elements 212 and 214 are multiple masks. In an alternative embodiment, element 212 can be a mandrel mask, and element 214 is formed by non-mandrels.

While examples shown in FIGS. 2A through 2C illustrate a staggered pattern of vias, it should be understood that other configurations are also possible. Other exemplary configurations are illustrated in FIGS. 3A through 3C and FIGS. 4A through 4C. Both FIGS. 3A and 4A show a similar layout of mandrel 302 and non-mandrel material 304 as that presented in FIG. 2A. They are each combined with a different block mask formation in FIGS. 3B and 4B. In FIG. 3B, stitching of block mask patterns is shown. Here, block masks 312 and 314 overlap with each other. The result, when combined with FIG. 3A, is shown in FIG. 3C. Vias 322 and 324 are next to each other in a configuration that might be difficult to achieve using prior art techniques because of the distance between vias 322 and 324—the vias shown are at approximately half the minimum pitch of the lithographic imaging tool. FIG. 4B illustrates that it is possible to combine stitching techniques with techniques shown in FIG. 2B, using block masks 412 and 414 in various configurations. In addition, FIG. 4B illustrates block mask shapes that are twice the dimension as that shown in FIG. 2B. The result is shown in FIG. 4C as vias 422 and 424.

The result is that staggered structures can be built at angles other than 0 degrees or 90 degrees, using only horizontal and vertical arrays of line/space patterns. Even though a process such as immersion lithography might produce its smallest critical dimensions that are vertical or horizontal, embodiments described herein allow the creation of vias smaller than the critical dimensions (up to 2× improvement in critical dimensions) and at non-orthogonal angles. The structures can be used to create vias using a variety of techniques now known in the art or developed in the future.

Figure 5B:
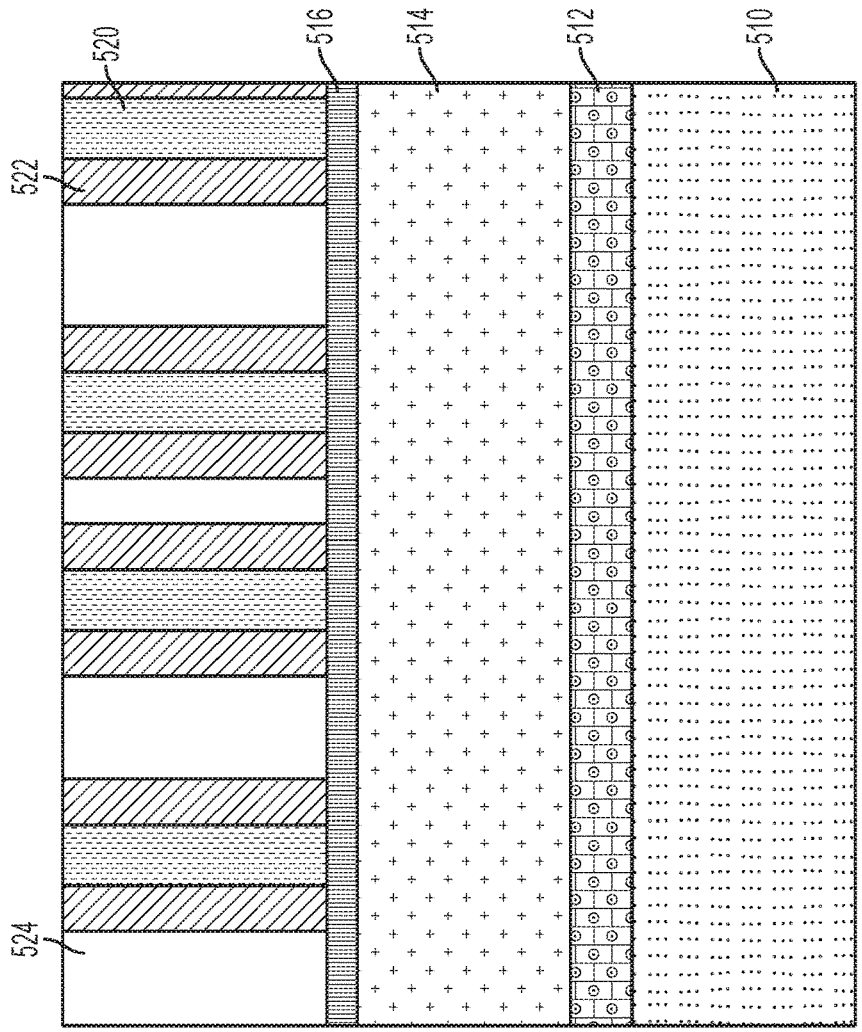
FIG. 5B depicts a cross-sectional view of a semiconductor device after an initial fabrication stage, following the addition of a mandrel, according to one or more embodiments.
Figure 5A:
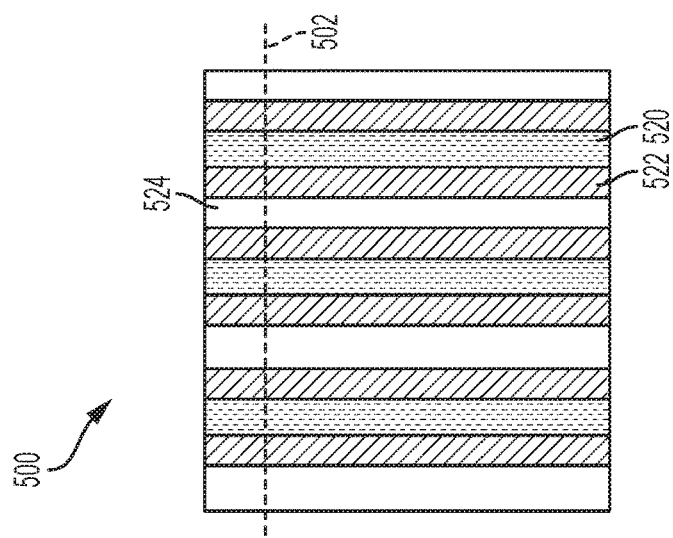
FIG. 5A depicts an overhead view of a semiconductor device after an initial fabrication stage, following the addition of a mandrel, according to one or more embodiments.

Beginning in FIGS. 5A and 5B, an illustration of the steps involved is presented in an exemplary form. FIG. 5A presents a top-down view of a portion of a semiconductor wafer 500. FIG. 5B presents a cross-section taken at the dotted line 502. As best seen in FIG. 5B, the semiconductor wafer has already received processing by this point. The front end of line (FEOL) has been completed and the back end of line (BEOL) has begun. It should be understood that there will be layers below the layers shown in FIGS. 5A and 5B, but they are not relevant to the following processing steps.

There are several layers present in FIG. 5B, including inter-layer dielectric (ILD) 510, a titanium nitride (TiN) mask 512, an optical planarization layer (OPL) 514, and a TiN hard mask 516. OPL 514 also might be called an organic under layer. Over the TiN hard mask are the portions that will define lines in the metal layers. There is an amorphous silicon mandrel 520. Next to mandrel 520 is a spacer 522. Spacer 522 might be one of a variety of different materials, such as an oxide or a nitride. The area in between each mandrel 520 is filled with a non-mandrel material 524, such as an organic spin-on material. Non-mandrel material 524 can comprise a spin on metallic material, a spin-on rare earth metal, a spin-on carbon, a spin-on silicon oxide, a deposited film such as carbon or oxide, and the like.

FIGS. 6A and 6B present the same views as FIGS. 5A and 5B, with many of the same features. Above mandrel 520, spacer 522 and non-mandrel 524 is an etch stop/hard mask 626. This could be an oxide or a nitride material. Over etch stop/hard mask 626 are a set of mandrels 628. Mandrels 628 are orthogonal to mandrel 520. In FIGS. 7A and 7B, spacer 730 is formed next to each mandrel 628.

Figure 8B:
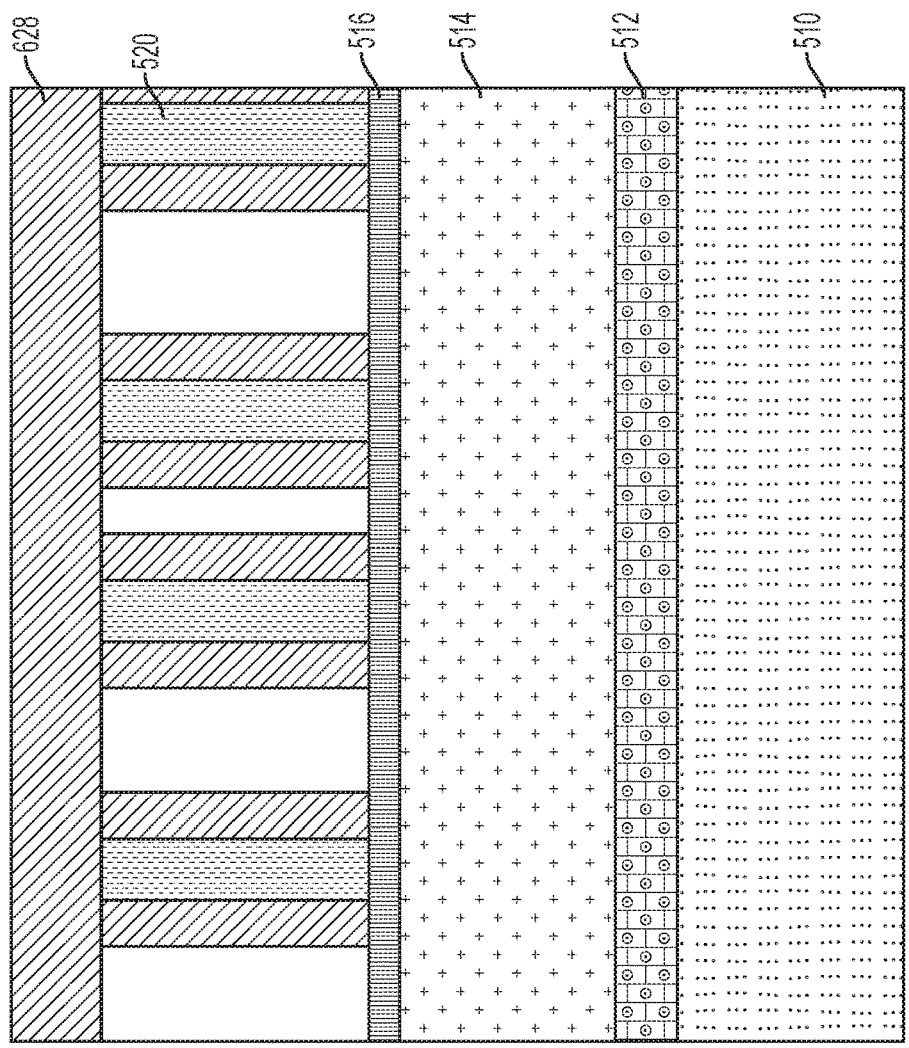
FIG. 8B depicts a cross-sectional view of the addition of a spacer to the top layer of mandrels.
Figure 8A:
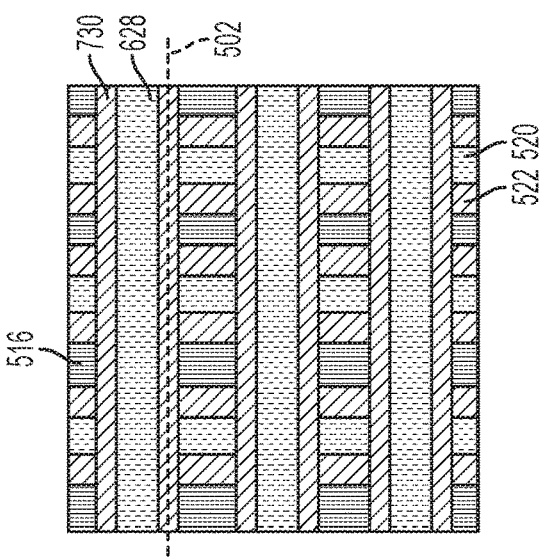
FIG. 8A depicts an overhead view of the addition of a spacer to the top layer of mandrels.
Figure 9B:
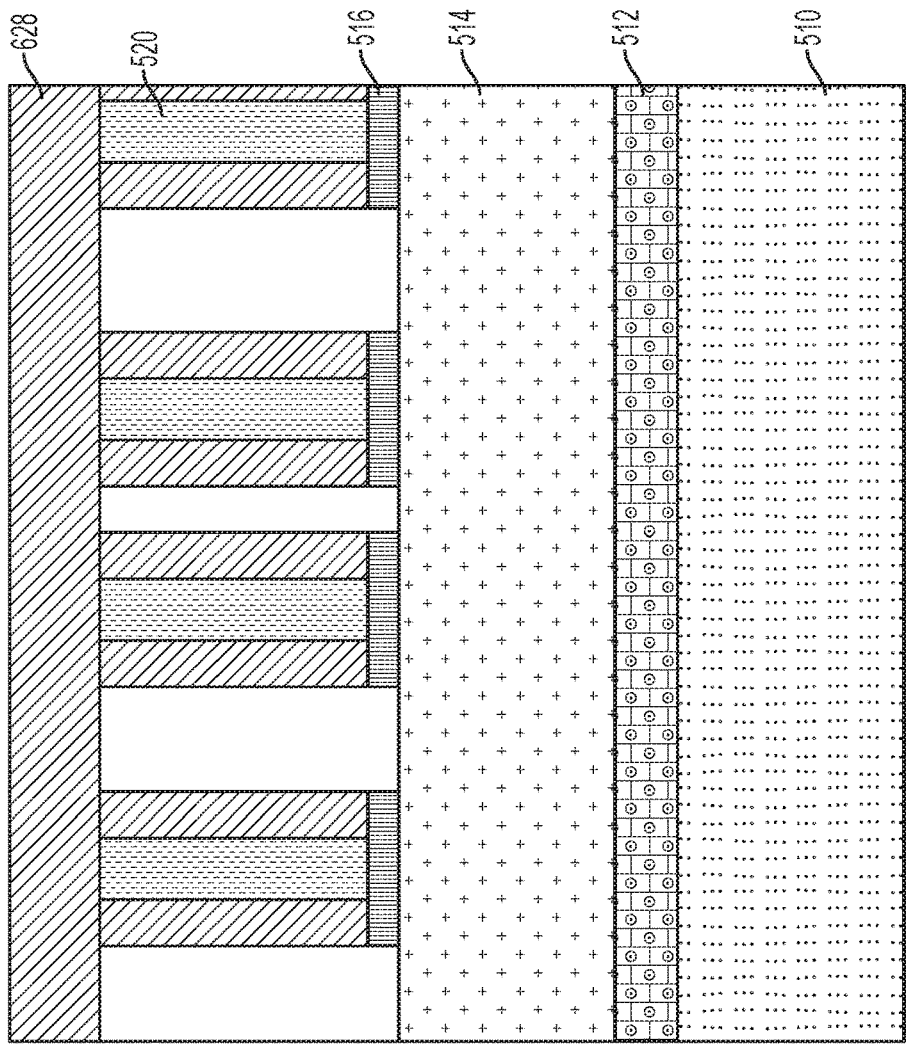
FIG. 9B depicts a cross-sectional view of the etching of exposed areas.
Figure 9A:
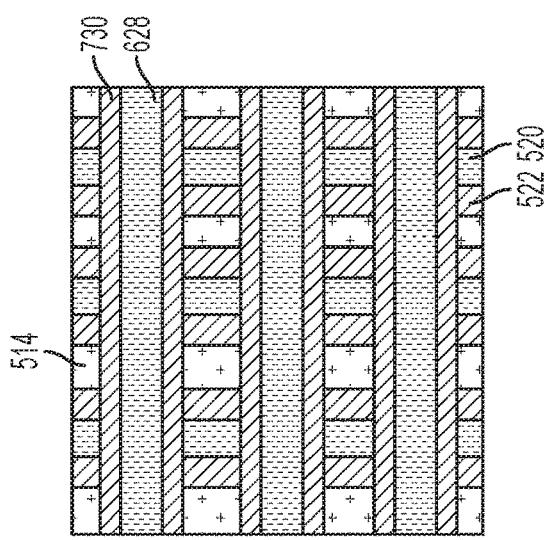
FIG. 9A depicts an overhead view of the etching of exposed areas.

In FIGS. 8A and 8B, the non-mandrel 524 is etched to the hard mask 516. This is not seen in FIG. 8B, because the cross-section is taken where a spacer 730 is present. But as seen in FIG. 8A, the non-mandrel material that is not covered by mandrel 628 or spacer 730 is removed at this step. In FIGS. 9A and 9B, the exposed areas of hard mask 516 are etched to expose OPL 514.

Figure 10B:
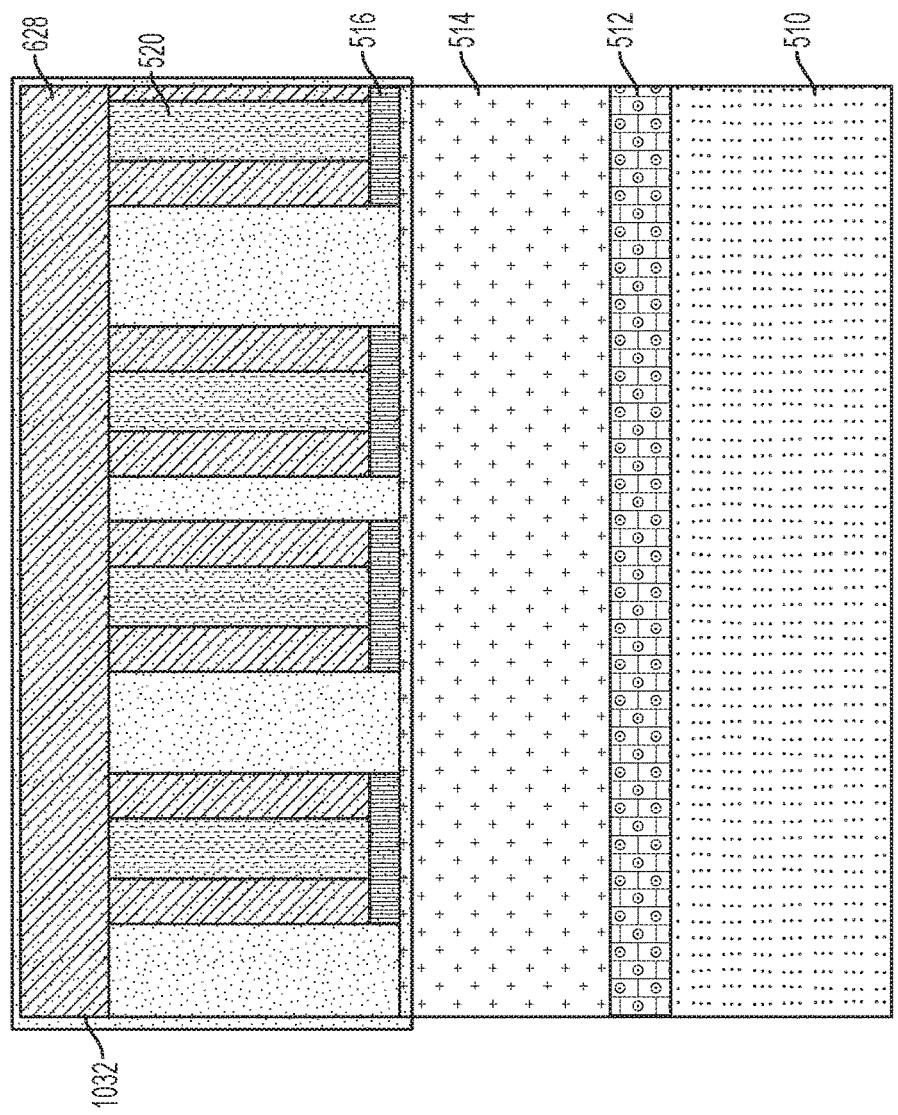
FIG. 10B depicts a cross-sectional view of a planarization step.
Figure 10A:
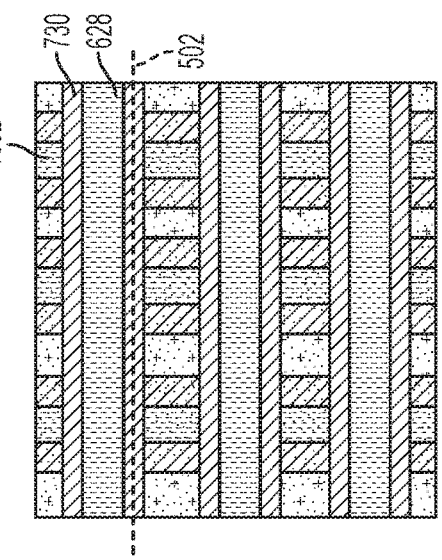
FIG. 10A depicts an overhead view of a planarization step.

In FIGS. 10A and 10B, a planarizing material 1032 is used to fill the areas removed in the previous two steps. Materials that can be spun-on or materials that can be deposited anisotropically from the bottom to top can be used as planarizing material 1032. Thereafter, a planarization step, such as a chemical-mechanical planarization or a develop and etch back, is performed on the first layer and the second layer. The portions of the newly applied material that are above the top of the mandrel is removed by the planarizing process.

In FIGS. 11A and 11B, mandrels 520 and mandrels 628 are removed to the level of hard mask 516. This can be accomplished via one of a variety of techniques known in the art. Thereafter, as shown in FIGS. 12A and 12B, the exposed areas of hard mask 516 are removed.

Figure 13B:
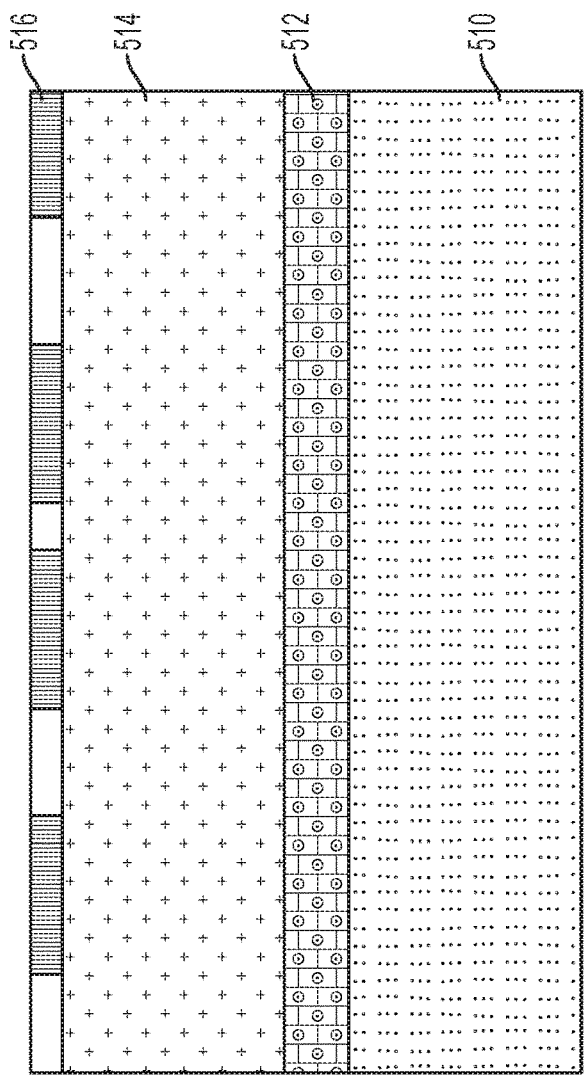
FIG. 13B depicts a cross-sectional view of the removal of spacers, the OPL, and non-mandrel layers.
Figure 13A:
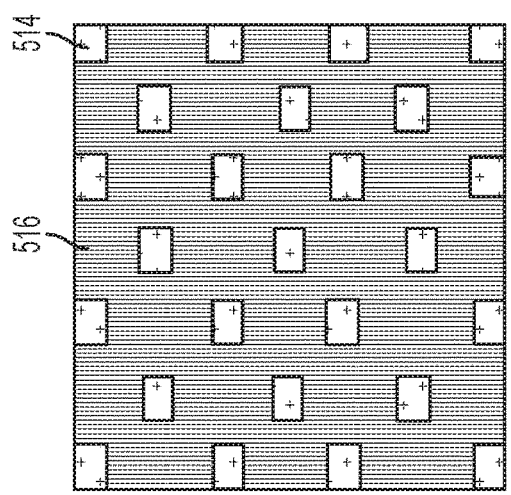
FIG. 13A depicts an overhead view of the removal of spacers, the OPL, and non-mandrel layers

In FIGS. 13A and 13B, the spacers, the OPL, and the non-mandrel layers are removed. They can be removed using an etching process. What remains are areas hard mask 516 and OPL 514 that establish what will eventually be the desired pattern of vias. Subsequent steps used to form the vias involve transferring this pattern through the hard mask 56 into ILD 510. These steps are known and will not be shown here.

Figure 14:
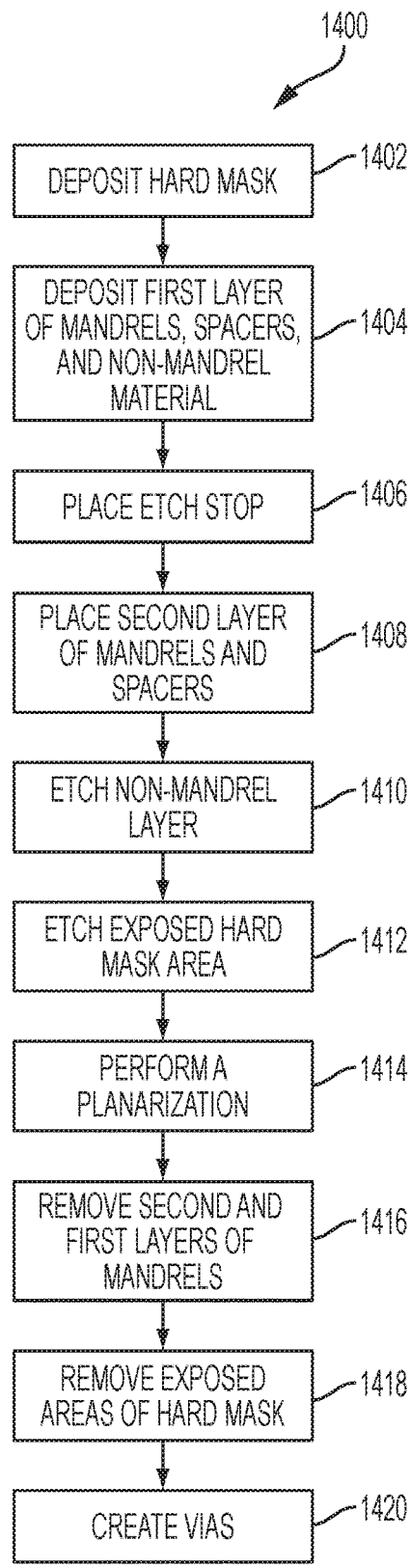
FIG. 14 is a flow diagram illustrating a methodology according to one or more embodiments.

FIG. 14 is a flow diagram illustrating a methodology 1400 according to one or more embodiments. Method 1400 is merely exemplary and is not limited to the embodiments presented herein. Method 1400 can be employed in many different embodiments or examples not specifically depicted or described herein. In some embodiments, the procedures, processes, and/or activities of method 1400 can be performed in the order presented. In other embodiments, the procedures, processes, and/or activities of method 1400 can be performed in any other suitable order. In still other embodiments, one or more of the procedures, processes, and/or activities of method 1400 can be combined or skipped.

Method 1400 begins with providing a semiconductor wafer in which the FEOL processes have been completed and the BEOL has begun with the depositing of the ILD and the OPL. After a hard mask is deposited (block 1402), a first layer containing mandrels, spacers, and non-mandrel material is formed (block 1404). An etch stop is deposited above the first layer of mandrels and spacers (block 1406). A second layer of mandrels and spacers, orthogonal to the first layer of mandrels, is formed (block 1408). The non-mandrel layer is etched to the hard mask (block 1410). A planarization is performed (block 1414). The second layer of mandrels and first layer of mandrels are removed to the level of the hard mask (block 1416). The exposed areas of the hard mask are then removed (block 1418). The result is a desired pattern of vias in the hard mask and OPL. Further processing is then performed to create the vias (block 1420).

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of forming vias, the method comprising:
providing a semiconductor wafer in which front end of line (FEOL) processing has been completed;
depositing a hard mask on an optical planarization layer (OPL);
forming a first layer with one or more mandrels on the hard mask;
placing a non-mandrel material between each of the one or more mandrels;
depositing an etch stop layer over the first layer of one or more mandrels;
forming a second layer with one or more mandrels on the etch stop layer;
etching the non-mandrel material that is not covered by the second layer; and
removing the one or more mandrels of the first layer and the one or more mandrels of the second layer down to the hard mark to form a pattern in the hard mask.

2. The method of claim 1, wherein each mandrel on the first layer of one or more mandrels is parallel to each other.

3. The method of claim 2, wherein each mandrel on the second layer of one or more mandrels is parallel to each other and orthogonal to each mandrel on the first layer of one or more mandrels.

4. The method of claim 1 further comprising:
forming one or more vias based on the pattern in the hard mask.

5. The method of claim 1, wherein:
forming the first layer of one or more mandrels on the hard mask further comprises forming spacers next to each of the one or more mandrels.

6. The method of claim 5, wherein:
forming the second layer of one or more mandrels on the hard mask further comprises forming spacers next to each of the one or more mandrels.

7. The method of claim 6, wherein the spacers are formed of an oxide.

8. The method of claim 1, wherein the hard mask comprises titanium nitride (TiN).

9. The method of claim 1, wherein the one or more mandrels are formed of an amorphous silicon.

10. The method of claim 1, wherein the non-mandrel fill is formed of an organic spin-on material.

11. The method of claim 1 further comprising performing a planarization of the first layer and the second layer after etching the non-mandrel material.

12. The method of claim 11 further comprising placing an organic planarizing layer prior to the planarization.

* * * * *